United States Patent
Sheridan et al.

(10) Patent No.: US 7,217,628 B2
(45) Date of Patent: May 15, 2007

(54) HIGH PERFORMANCE INTEGRATED VERTICAL TRANSISTORS AND METHOD OF MAKING THE SAME

(75) Inventors: David C. Sheridan, Williston, VT (US); Peter B. Gray, Essex Junction, VT (US); Jeffrey B. Johnson, Essex Junction, VT (US); Qizhi Liu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,685

(22) Filed: Jan. 17, 2005

(65) Prior Publication Data

US 2006/0157823 A1 Jul. 20, 2006

(51) Int. Cl.
*H01L 21/8228* (2006.01)
(52) U.S. Cl. ...................... 438/322; 438/340
(58) Field of Classification Search ............... 257/565, 257/566, 574, 197, 198; 438/322, 340
See application file for complete search history.

(56) References Cited

U.S. PATENT DOCUMENTS

| 4,997,776 | A | | 3/1991 | Harame et al. |
| 5,315,151 | A | | 5/1994 | Hsieh et al. |
| 5,583,059 | A | * | 12/1996 | Burghartz ................... 438/319 |
| 5,930,635 | A | | 7/1999 | Bashir et al. |
| 6,472,288 | B2 | * | 10/2002 | Freeman et al. ............ 438/369 |
| 6,909,164 | B2 | * | 6/2005 | Gray et al. .................. 257/565 |
| 2002/0084495 | A1 | | 7/2002 | Kim et al. |
| 2003/0008443 | A1 | | 1/2003 | Sicard et al. |
| 2003/0183903 | A1 | | 10/2003 | Ikeda |
| 2003/0219952 | A1 | | 11/2003 | Fujimaki |

* cited by examiner

*Primary Examiner*—Sara Crane
(74) *Attorney, Agent, or Firm*—DeLio & Peterson, LLC; Robert Curcio; Anthony Canale

(57) ABSTRACT

A complementary bipolar transistor is fabricated using an available portion of a silicon germanium (SiGe) low temperature epitaxial layer as the raised base region for a vertical NPN transistor, and another portion of the same SiGe LTE layer as a vertical PNP collector layer. The complementary pair of transistors is vertically aligned and operates in a single direction.

12 Claims, 7 Drawing Sheets

HIGH PERFORMANCE INTEGRATED VERTICAL TRANSISTORS AND METHOD OF MAKING THE SAME

BACKGROUND OF THE INVENTION

1. Field of the Invention

This invention relates to semiconductor integrated circuit devices, and specifically to integrated BICMOS vertical transistors, and a method for making the same. More specifically, the invention relates to a vertical PNP transistor, and a set of complementary vertical NPN and PNP transistors in a downward mode or collector down configuration.

2. Description of Related Art

Integrated circuit technologies are predominantly of the NPN type, generally without an available high-speed complementary PNP device. Circuit designers would certainly benefit from the inclusion of a complementary PNP device; however, in the development of a complementary PNP transistor, cost becomes a dominant factor. It has been a continuing technological challenge to integrate vertical PNP devices into a high performance NPN process without significantly degrading the performance of the NPN device. A problem for complementary transistors using the same layers and process fabrication steps is that the mode of operation of the two devices is different, i.e., one operates in an upward direction and the other operates in a downward direction. This is due to the order of the material layers deposited and implanted with dopants for the emitter, base and collector regions of each transistor.

One prior art example of a complementary transistor structure is found in U.S. Pat. No. 4,997,776 issued to Harame, et al., on Mar. 5, 1991 entitled, "COMPLEMENTARY BIPOLAR TRANSISTOR STRUCTURE AND METHOD FOR MANUFACTURE." The Harame structure includes a vertical NPN transistor operating in the upward direction and a vertical PNP transistor operating in a downward direction. The intrinsic vertical profiles for both the NPN and PNP transistors are formed by depositing a first layer of p-doped silicon and a second layer of n-doped silicon. These layers form the intrinsic base and collector regions for both the NPN and PNP transistors. The first layer forms the base and the second layer the collector for an NPN transistor operating in an upward direction. Simultaneously, the second layer forms the base and the first layer forms the collector for a PNP transistor operating in a downward direction. Importantly, Harame has two SiGe layers, one n-type and one p-type for forming the complementary pair of upward and downward transistors. In the present invention, only one SiGe layer is taught for two downward complementary transistors.

In U.S. Pat. No. 5,930,635 issued to Bashir, et al., on Jul. 27, 1999 entitled, "COMPLEMENTARY SI/SIGE HETEROJUNCTION BIPOLAR TECHNOLOGY," bipolar transistors are formed on a common substrate. The transistors are vertical NPN and PNP transistors, which have identical structure and modes of operation with both devices operating in the downward direction. However, the emitter region of the PNP transistor is not the same layer as the base region of the NPN transistor.

Bearing in mind the problems and deficiencies of the prior art, it is therefore an object of the present invention to provide a complementary pair of transistors that are vertically aligned and operate in a single direction.

It is another object of the present invention to provide vertical transistors that share a single layer to form the extrinsic base of an NPN transistor and an emitter of a PNP transistor.

A further object of the invention is to provide a vertically aligned PNP transistor that shares its emitter layer with the base layer of a vertically aligned NPN transistor, and utilizes an epitaxial growth process to form a PNP base/collector region and NPN base/collector region where the PNP emitter layer is also used as the NPN base layer.

It is yet another object of the present invention to provide a method of making vertical transistors where the base layer for the NPN and PNP transistors are in the same SiGe LTE layer.

Still other objects and advantages of the invention will in part be obvious and will in part be apparent from the specification.

SUMMARY OF THE INVENTION

The above and other objects, which will be apparent to those skilled in the art, are achieved in the present invention, which in a first aspect is directed to a semiconductor structure on a substrate comprising: a downwards operating vertical NPN transistor formed on the substrate and having an epitaxial extrinsic base region, an emitter region, and a collector region, and a downwards-operating vertical PNP transistor formed on the substrate having an epitaxial base region, an emitter region, and a collector region; wherein the base region of the vertical NPN transistor comprises a first portion of a first layer and the base region of the vertical PNP transistor comprises a second portion of the first layer. The first layer may comprise epitaxial silicon germanium (SiGe). The epitaxial SiGe may include a first dopant type, such as a p-type dopant. A portion of the emitter of the PNP transistor may include a portion of the second portion of the first layer. The intrinsic base of the NPN transistor may comprise the first portion of the first layer. Additionally, an extrinsic base of the NPN transistor may include a first portion of a second layer and the emitter of the PNP transistor may include a second portion of the second layer.

In a second aspect, the present invention is directed to a semiconductor structure on a substrate comprising a downwards operating vertical PNP transistor formed on the substrate having a base region, an emitter region, and a collector region wherein the collector region of the vertical PNP transistor is formed on a same layer on the substrate as a collector region for a downwards operating vertical NPN transistor.

In a third aspect, the present invention is directed to a method of fabricating complementary bipolar vertical NPN and PNP transistor structure in a wafer, having an NPN collector, base, and emitter region, and a PNP collector, base, and emitter region, the method comprising: forming a p-well and an n-region subcollector in the wafer along isolation trenches; implanting p+ and n+ collector reach through implants; applying a silicon germanium LTE layer and PNP base mask layer, wherein the silicon germanium LTE layer is formed on the p-well and the n-subcollector; forming a first photoresist mask to protect the p+ collector reach through implant, the n+ collector reach through implant, and the isolation trenches during implanting; implanting an n-type PNP base/collector within the silicon germanium LTE layer; patterning a barrier oxide etch stop layer over the silicon germanium LTE layer including patterning an opening in the etch stop layer over a PNP base/collector region and a portion of the etch stop layer over the NPN base/collector region; growing a p+ polysilicon or p+ silicon layer over the etch stop layer; depositing a barrier oxide layer on the p+ polysilicon or p+ silicon layer; patterning and etching the barrier oxide layer over the NPN base/collector layer; depositing an n+ polysilicon layer or n+ silicon layer over the barrier oxide layer; patterning and etching the n+ polysilicon or n+ silicon layer; forming a second photoresist mask over the barrier oxide layer and unprotected portions of the p+ polysilicon layer or p+ silicon layer, and removing portions of the oxide layer by etching to the etch stop layer; forming a nitride spacer on sides of the PNP base and emitter and the NPN base and emitter; forming a mask over the PNP base and emitter, the NPN base and emitter, and a portion of the silicon germanium LTE layer up to the isolation trenches; removing unprotected portions of the silicon germanium LTE layer and the etch stop layer by a etch process; removing the etch stop layer to expose the silicon germanium LTE layer in all remaining areas except where the PNP and NPN bases and emitters reside; patterning the structure with a third photoresist mask over the isolation trenches; implanting exposed regions for an n+ region for the PNP extrinsic base; and depositing contacts for collectors, bases, and emitters of the PNP and NPN structures.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-11 of the drawings in which like numerals refer to like features of the invention.

The present invention provides a complementary bipolar transistor fabricated using a shared silicon germanium (SiGe) low temperature epitaxial (LTE) layer, wherein the epitaxially deposited raised extrinsic base layer of the NPN transistor is also used for the PNP diffused emitter layer. Both the NPN and PNP base and emitter regions are fully or partially contained in the LTE layer. The collector region of the PNP and NPN transistors may be inside the LTE layer as well, although not necessitated. An available in-situ doped arsenic base polysilicon layer is used as the vertical PNP emitter layer. The present invention utilizes advanced epitaxial techniques, such as molecular beam epitaxy (MBE) and low temperature epitaxy (LTE) by ultra high vacuum chemical vapor deposition (UHV/CVD) to provide identical vertical profiles. Both the PNP and NPN transistors may share the same SiGe layer, which acts as the base layer for both transistors. In this embodiment, the p+ in-situ doped region of the SiGe layer acts as the base for the NPN and part of the emitter for the PNP transistor.

Additionally, the PNP and NPN transistors may share a silicon/polysilicon layer instead of a SiGe layer, where the extrinsic base of the NPN is formed on the same silicon/polysilicon layer as the emitter of the PNP transistor.

The PNP base and collector profile are obtained through selective implantation using an added mask. The PNP emitter profile diffusion is simultaneously optimized with the NPN extrinsic base diffusion, ensuring the intrinsic p-type base is sufficiently covered by the out-diffusion from the p-type emitter polysilicon. Using the SiGe LTE layer enables a higher breakdown PNP and additional capability for collector design.

Figure 1:
FIG. 1 depicts a cross-sectional view of a starting wafer for the present invention.
Figure 2:
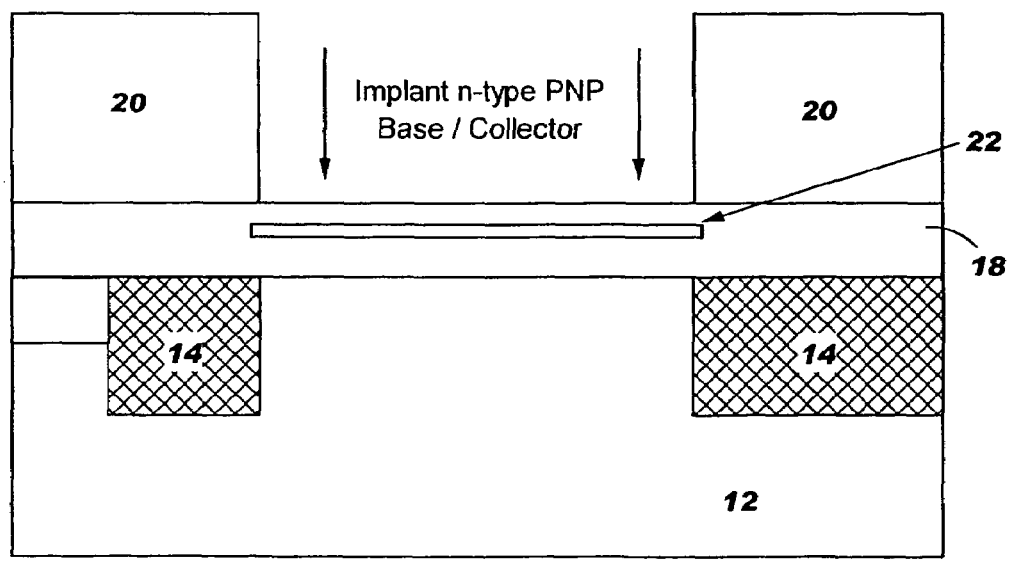
FIG. 2 depicts the vertical PNP transistor after the SiGe LTE layer and PNP base mask are applied.

FIGS. 1-10 depict cross-sectional views showing the method of making the vertical PNP transistor, or the complementary NPN and PNP transistors on a common substrate for the present invention. FIG. 1 depicts a cross-sectional view of a starting wafer 10 for the present invention. A p-well 12 is established in the wafer along with isolation trenches 14 and p+ implants 16 for collector contacts. Wells and buried layer regions are formed from methods well known in the semiconductor industry. The planar shallow or deep trench isolation structures are formed to isolate the active device regions. These isolation regions are preferably formed by a conventional low temperature deep trench process, wherein a masking layer, such as silicon nitride, is deposited on the surface of the substrate, and windows are etched in the region. FIG. 2 depicts the vertical PNP transistor after the SiGe LTE layer 18 and PNP base mask are applied. In a similar fashion to the development of an NPN transistor, the silicon germanium LTE layer 18 is formed on the prepared p-well. A photoresist mask 20 is formed to protect the p+ source/drain implants 16 and the isolation trenches 14 during implanting. An n-type PNP base/collector 22 is implanted within the SiGe LTE layer 18.

Figure 3:
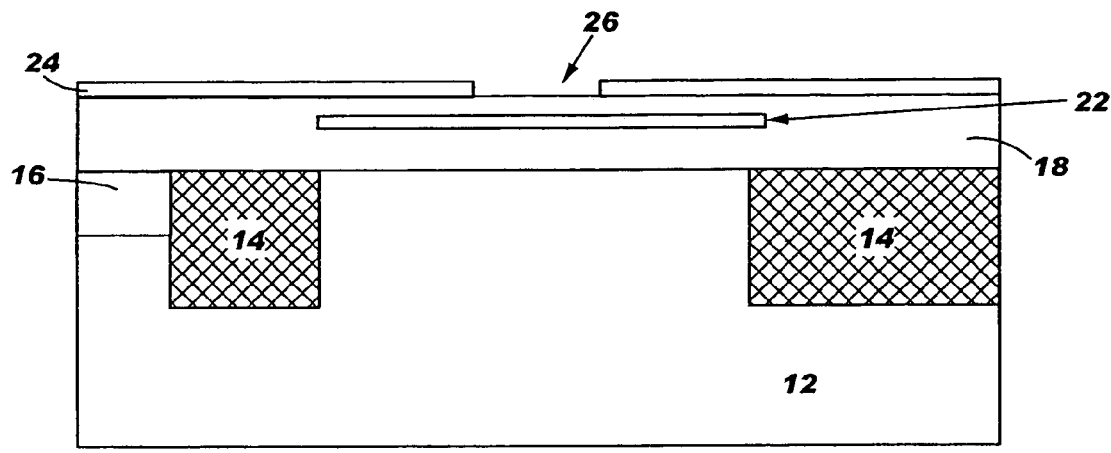
FIG. 3 is depicts the vertical PNP transistor of FIG. 2 with an oxide layer patterned and formed over the SiGe LTE layer for the emitter opening.
Figure 4:
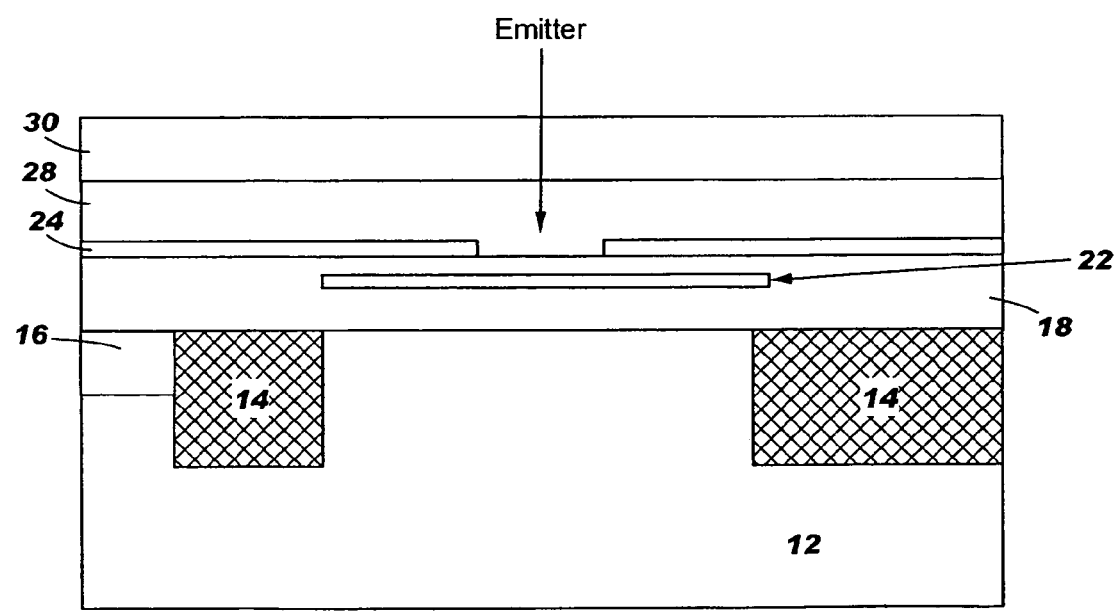
FIG. 4 depicts the vertical PNP transistor of FIG. 3 with a polysilicon layer and barrier oxide layer applied.

As depicted in FIG. 3, an oxide layer 24 is then patterned and formed over the SiGe LTE layer 18 with a space 26 over the PNP base/collector 22. As shown in FIG. 4, a p+ polysilicon layer 28 is then grown or deposited over the etch stop layer 24. This p+ polysilicon layer 28 is in-situ doped, and represents the emitter for the vertical PNP transistor and the extrinsic base of the NPN transistor. A barrier oxide 30 is then deposited on the p+ emitter polysilicon layer 28.

Figure 5:
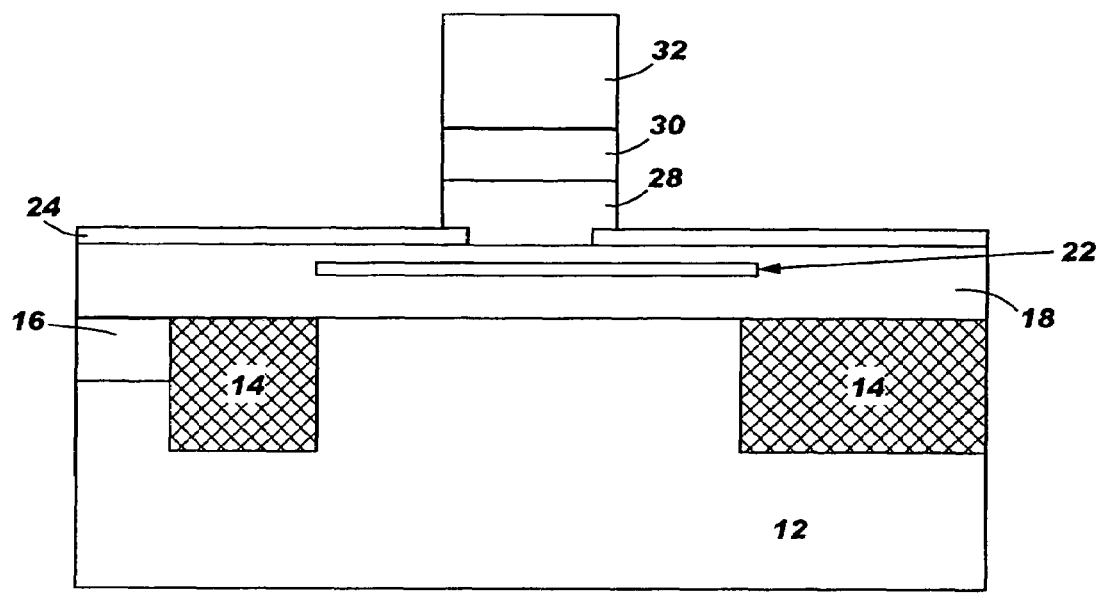
FIG. 5 depicts the vertical PNP transistor of FIG. 4 after patterning and etching the emitter.
Figure 6:
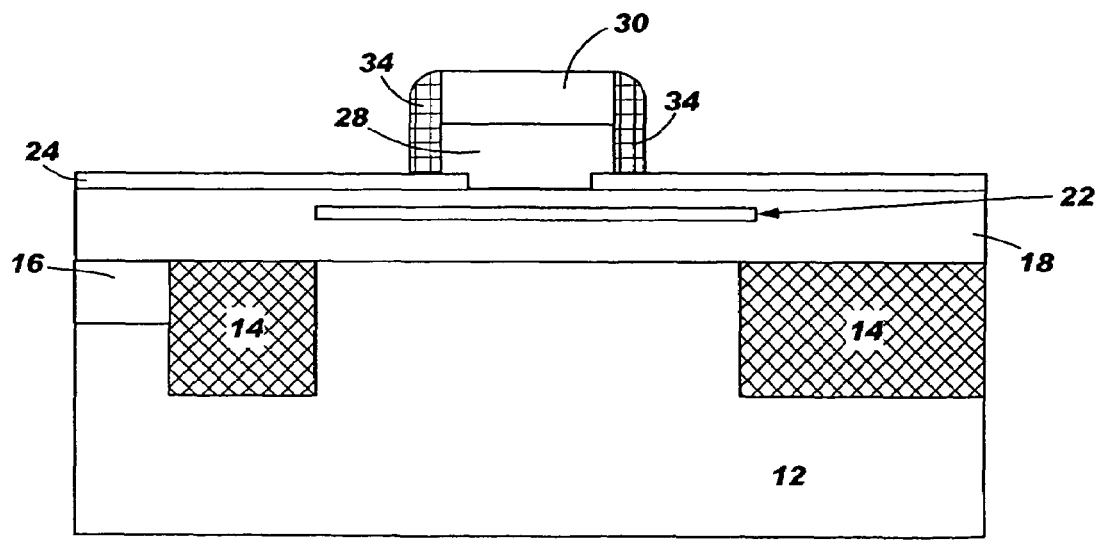
FIG. 6 depicts a nitride spacer formed on the sides of the PNP base/emitter of FIG. 5.

FIG. 5 depicts the vertical PNP transistor after patterning and etching of the emitter. A photoresist mask 32 is formed over the barrier oxide layer 30 and the unprotected portions of the p+ polysilicon layer 28 and oxide layer 30 are removed by etching to the etch stop layer 24. In this manner, the PNP base/emitter is patterned. Importantly, the mask is the same as that used for an NPN transistor extrinsic base formation, and does not require any extra process steps at this stage for the complementary PNP version. A nitride spacer 34 is then formed on the sides of the PNP base/emitter, as shown in FIG. 6.

Figure 7:
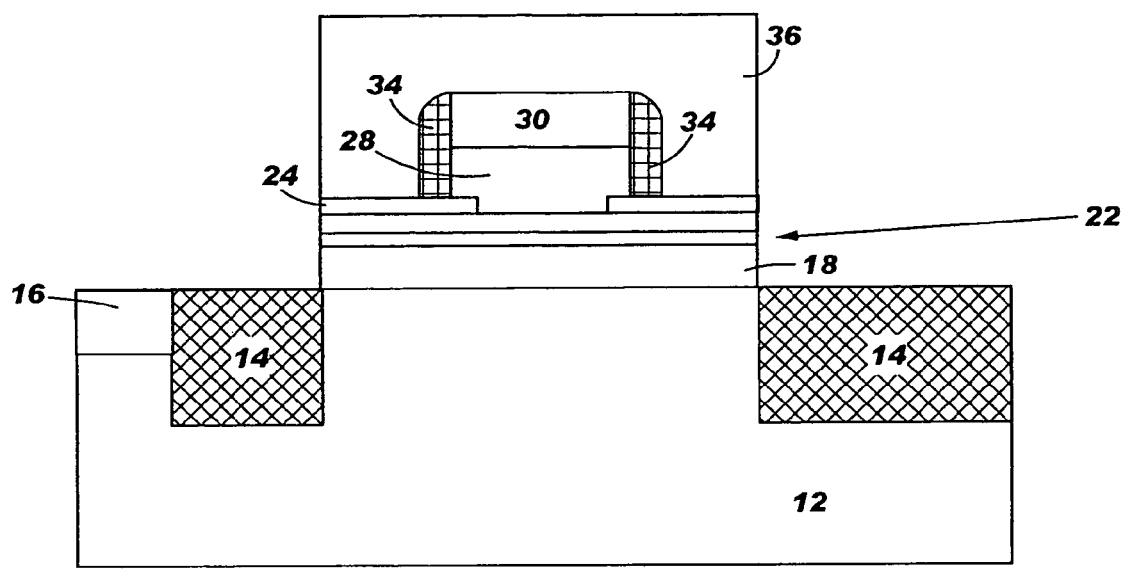
FIG. 7 depicts a mask formed over the PNP emitter and a portion of the SiGe LTE layer up to the isolation trenches.

FIG. 7 shows a mask 36 formed over the PNP base/emitter and a portion of the SiGe LTE layer up to the isolation trenches 14. The unprotected portions of the SiGe LTE layer 18 and the etch stop layer 24 are removed by a second etch process. As shown, the PNP base/collector 22 spans the length between the isolation trenches 14 within the SiGe LTE layer.

Figure 8:
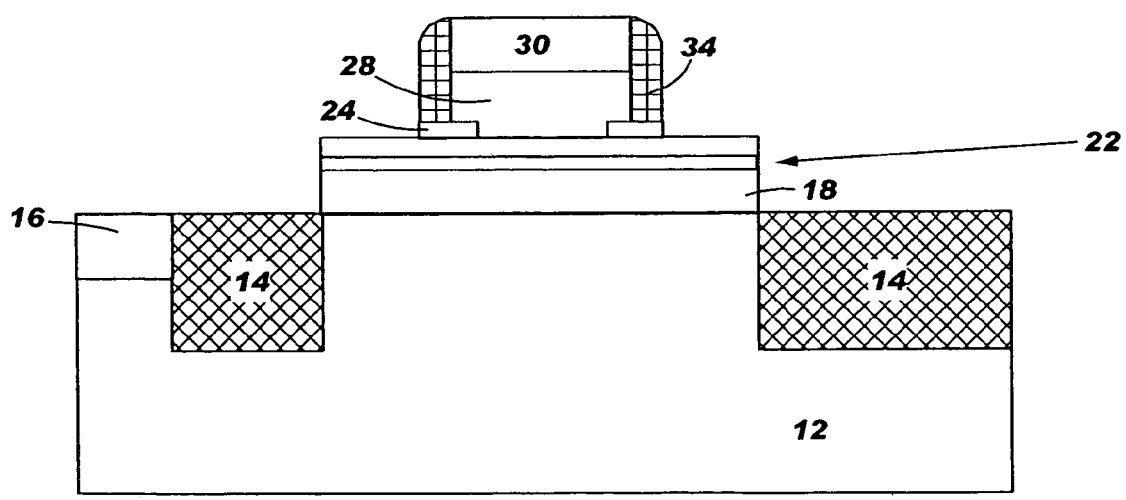
FIG. 8 depicts the vertical PNP transistor of FIG. 7 with the oxide layer removed.
Figure 9:
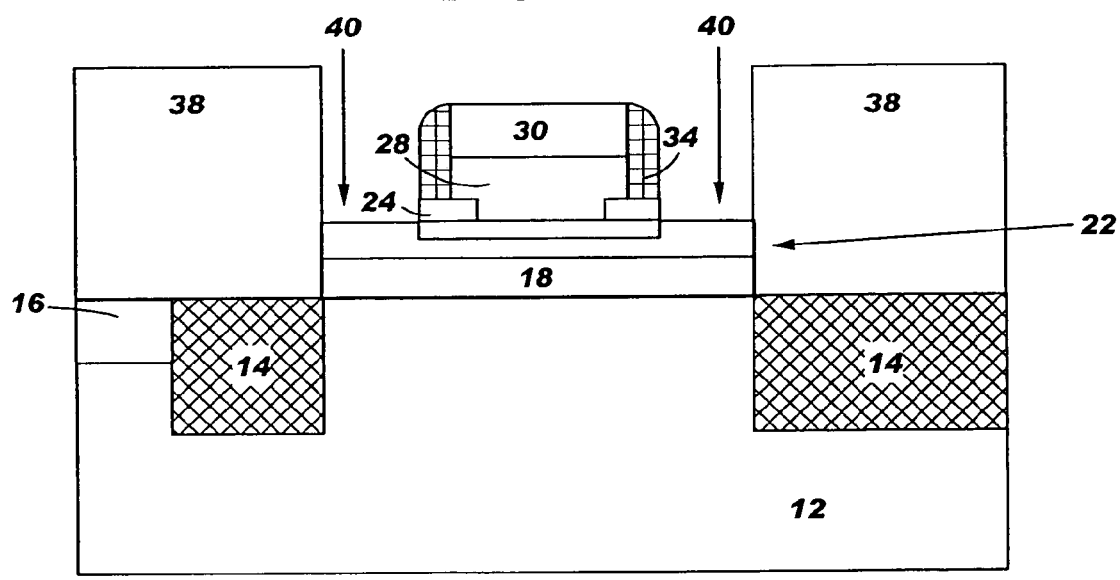
FIG. 9 depicts the vertical PNP transistor patterned with a photoresist mask over the isolation trenches, with the exposed region implanted for an n+ extrinsic base.

The oxide layer is then removed to expose the SiGe LTE layer 18 in all remaining areas except under the emitter and outside the nitride spacer. FIG. 8 depicts the vertical PNP transistor with the LE oxide layer removed. As shown in FIG. 9, the transistor is again patterned with a photoresist mask 38 over the isolation trenches, and the exposed region 40 is implanted for an n+ extrinsic base.

Figure 10:
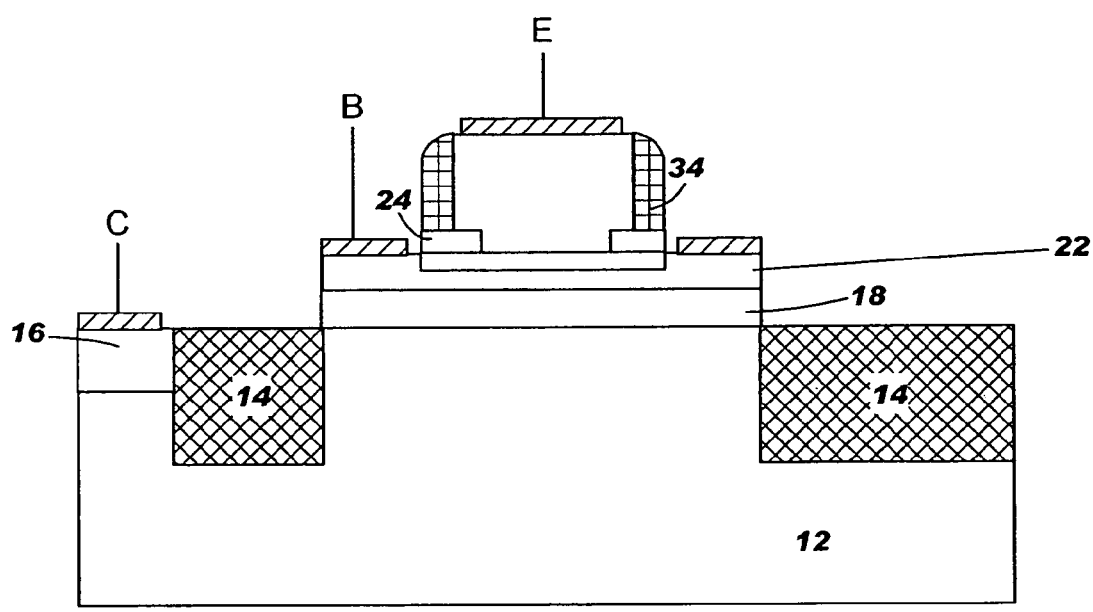
FIG. 10 depicts the final vertical PNP structure with the emitter oxide removed and contacts deposited for the collector (c), base (b), and emitter (e).

FIG. 10 depicts the final vertical PNP structure 100 with the emitter oxide removed and contacts deposited for the collector (c), base (b), and emitter (e). The contact regions are defined and opened by removing the appropriate portions of the oxide layer. A metallization step is then used to form the contacts.

Importantly, the polysilicon layer is capable of forming a raised external base for an NPN configuration, or an emitter in a PNP configuration, or both. A portion of the emitter may be formed intrinsically from the base layer of the NPN, which is part of the SiGe LTE layer. The Germanium layer includes the p+ base of the NPN when the intrinsic base polysilicon layer of the NPN forms the emitter for the vertical PNP. Additionally, the base regions of the PNP and NPN transistors comprise the same SiGe LTE layer. The SiGe LTE layer is preferably of a p-type dopant.

Figure 11:
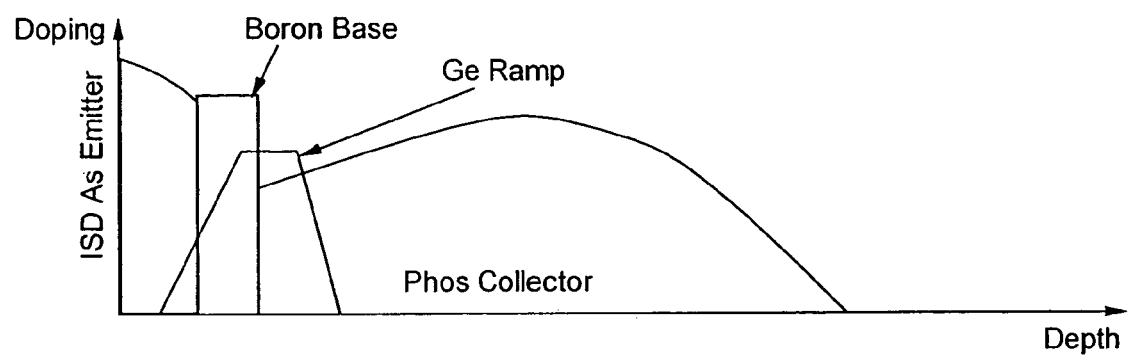
FIG. 11 depicts the doping profile for the SiGe NPN and SiGe PNP transistors using the same LTE.
Figure 11:
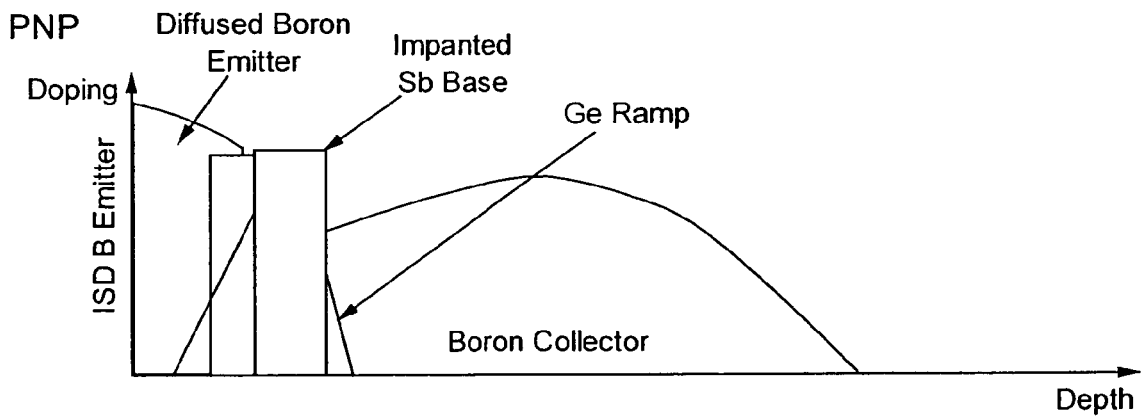

FIG. 11 depicts the doping profile for the SiGe NPN and SiGe PNP transistors using the same LTE. In FIG. 11, the boron base represents the in-situ boron layer that acts as the NPN base and part of the PNP emitter. Doping as a function of depth is illustrated for the NPN transistor and compared to the PNP.

The complementary bipolar transistor structure of the invention is fabricated such that the NPN and PNP transistors both operate in a downward fashion while sharing the same SiGe layer. The low temperature epitaxial techniques of MBE and LTE allow for the desired downward direction of the transistors' operation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention. The terms and expressions employed are terms of description not limitation, and there is no intention of using such terms to exclude any equivalents of the features shown and described, or portions thereof.

What is claimed is:

1. A method of fabricating complementary bipolar vertical NPN and PNP transistor structure in a wafer, having an NPN collector, base, and emitter region, and a PNP collector, base, and emitter region, said method comprising:
    forming a p-well and an n-region subcollector in said wafer along isolation trenches;
    implanting p+ and n+ collector reach through implants;
    applying a silicon germanium LTE layer and PNP base mask layer, wherein said silicon germanium LTE layer is formed on said p-well and said n-subcollector;
    forming a first photoresist mask to protect said p+ collector reach through implant, said n+ collector reach through implant, and said isolation trenches during implanting;
    implanting an n-type PNP base/collector within said silicon germanium LTE layer;
    patterning a barrier oxide etch stop layer over said silicon germanium LTE layer including patterning an opening in said etch stop layer over a PNP base/collector region and a portion of said etch stop layer over said NPN base/collector region;
    growing a p+ polysilicon or p+ silicon layer over said etch stop layer; depositing a barrier oxide layer on said p+ polysilicon or p+ silicon layer; patterning and etching said barrier oxide layer over said NPN base/collector layer; depositing an n+ polysilicon layer or n+ silicon layer over said barrier oxide layer;
    patterning and etching said n+ polysilicon or n+ silicon layer;
    forming a second photoresist mask over said barrier oxide layer and unprotected portions of said p+ polysilicon layer or p+ silicon layer, and removing portions of said oxide layer by etching to said etch stop layer;
    forming a nitride spacer on sides of said PNP base and emitter and said NPN base and emitter;
    forming a mask over said PNP base and emitter, said NPN base and emitter, and a portion of said silicon germanium LTE layer up to said isolation trenches;
    removing unprotected portions of said silicon germanium LTE layer and said etch stop layer by a etch process;
    removing said etch stop layer to expose said silicon germanium LTE layer in all remaining areas except where said PNP and NPN bases and emitters reside;
    patterning said structure with a third photoresist mask over said isolation trenches;
    implanting exposed regions for an n+ region for said PNP extrinsic base; and
    depositing contacts for collectors, bases, and emitters of said PNP and NPN structures.

2. The method of claim 1 wherein said p+ polysilicon layer is in-situ doped, and represents an emitter for said vertical PNP transistor.

3. The method of claim 1 wherein said PNP and said NPN transistors operate in a downward fashion.

4. A method of fabricating complementary bipolar vertical NPN and PNP transistor structure in a wafer, having an NPN collector, base, and emitter region, and a PNP collector, base, and emitter region, said method comprising:
    forming a p-well and an n-region subcollector in said wafer along isolation trenches;
    implanting p+ and n+ collector reach through implants;
    applying a silicon germanium LTE layer and PNP base mask layer, wherein said silicon germanium LTE layer is formed on said p-well and said n-subcollector;
    implanting an n-type PNP base/collector within said silicon germanium LTE layer;
    patterning a barrier oxide etch stop layer over said silicon germanium LTE layer;
    growing a p+ polysilicon or p+ silicon layer;
    depositing a barrier oxide layer on said p+ polysilicon or p+ silicon layer;
    depositing an n+ polysilicon layer or n+ silicon layer over said barrier oxide layer;

forming a nitride spacer on sides of said PNP base and emitter and said NPN base and emitter;

forming a mask over said PNP base and emitter, said NPN base and emitter, and a portion of said silicon germanium LTE layer up to said isolation trenches;

removing unprotected portions of said silicon germanium LTE layer and said etch stop layer by a etch process;

implanting exposed regions for an n+ region for said PNP extrinsic base; and depositing contacts for collectors, bases, and emitters of said PNP and NPN structures.

5. The method of claim 4 further including forming a first photoresist mask to protect said p+ collector reach through implant, said n+ collector reach through implant, and said isolation trenches during implanting.

6. The method of claim 4 wherein said step of patterning said barrier oxide etch stop layer over said silicon germanium LTE layer further includes patterning an opening in said etch stop layer over a PNP base/collector region and a portion of said etch stop layer over said NPN base/collector region.

7. The method of claim 4 wherein said step of growing said p+ polysilicon or p+ silicon layer includes growing said p+ polysilicon or p+ silicon layer over said etch stop layer.

8. The method of claim 4 including patterning and etching said barrier oxide layer over said NPN base/collector layer.

9. The method of claim 4 including patterning and etching said n+ polysilicon or n+ silicon layer.

10. The method of claim 4 further including forming a second photoresist mask over said barrier oxide layer and unprotected portions of said p+ polysilicon layer or p+ silicon layer, and removing portions of said oxide layer by etching to said etch stop layer.

11. The method of claim 4 including removing said etch stop layer to expose said silicon germanium LTE layer in all remaining areas except where said PNP and NPN bases and emitters reside.

12. The method of claim 4 including patterning said structure with a third photoresist mask over said isolation trenches.

* * * * *